United States Patent [19]

Maddox, III

[11] 4,394,182

[45] Jul. 19, 1983

[54] MICROELECTRONIC SHADOW MASKING PROCESS FOR REDUCING PUNCHTHROUGH

[75] Inventor: Roy L. Maddox, III, Westminster, Calif.

[73] Assignee: Rockwell International Corporation, El Segundo, Calif.

[21] Appl. No.: 311,206

[22] Filed: Oct. 14, 1981

[51] Int. Cl.³ .................... B01J 17/00; H01L 21/265
[52] U.S. Cl. ........................ 148/1.5; 29/571; 29/576 B; 148/187; 357/23; 357/91
[58] Field of Search .................. 148/1.5, 187; 29/571, 29/576 B; 357/91, 23 S

[56] References Cited

U.S. PATENT DOCUMENTS

| | | | |
|---|---|---|---|
| 4,090,289 | 5/1978 | Dennard et al. | 29/571 |
| 4,114,256 | 9/1978 | Thibault et al. | 29/571 |
| 4,149,904 | 4/1979 | Jones | 148/1.5 |
| 4,182,023 | 1/1980 | Cohen et al. | 148/1.5 |
| 4,198,250 | 4/1980 | Jecmen | 148/1.5 |
| 4,268,951 | 5/1981 | Elliott et al. | 29/571 |
| 4,285,761 | 8/1981 | Fatula et al. | 29/571 |
| 4,319,395 | 3/1982 | Lund et al. | 29/571 |
| 4,329,186 | 5/1982 | Kotecha et al. | 29/571 |

OTHER PUBLICATIONS

Dennard et al., IEEE—Jour. Solid State Circuit, 9 (1974), 256.
Hunter et al., IEEE—Trans. Electron Devices, 26 (1979) 354.
W. G. Oldham and E. Hieke, IEEE Electron Device Letters, vol. EDL-1, No. 10, Oct. 1980, p. 217, "A High Resolution Negative Electron Resist by Image Reversal".

*Primary Examiner*—Upendra Roy
*Attorney, Agent, or Firm*—Daniel R. McGlynn; Randall G. Wick; H. Fredrick Hamann

[57] ABSTRACT

A process for forming a doped region in a substrate which is in alignment with a circuit member by forming a masking member on a layer, the masking member defining the outline on the circuit member; and etching the layer employing the masking member as a mask to define the circuit member, the etching continuing such that the circuit member includes sloping side faces. Subsequently, a dopant species is implanted into the substrate so as to form the doped region, the dosage and energy of ions implanted being selected such that ions are partially blocked by the portion of the circuit member beneath the sloping side faces thereby providing a more lightly doped and more shallow distribution of implanted species region than in other regions.

26 Claims, 7 Drawing Figures

MICROELECTRONIC SHADOW MASKING PROCESS FOR REDUCING PUNCHTHROUGH

BACKGROUND OF THE INVENTION

1. Field of the Invention

The invention relates to shadow masking processes in microelectronic fabrication, particularly those employed in silicon-on-sapphire (SOS) processes.

2. Description of the Prior Art

The fabrication of integrated circuits such as metal oxide semiconductor (MOS) circuits employing a mask and photolithographic techniques is well known in the art. One of these methods, known as the self-aligned gate procedure, utilizes a gate conductor pattern to shield the channel region of the device from N+ or P+ ion implantation during formation of the source and drains of the device. In such processes, the entire dimension of the gate, L, shields the channel region which has an area L by W (wherein W is within the channel region) from the N+ or P+ ion implantation due to the thickness of the gate conductor. The source and drain regions of the device fabricated according to such a self-aligned gate process are not appreciably overlapped by the gate and therefore the Miller capacitance of the device is minimized.

Although such a procedure is adequate for many standard commercial products, when the channel of the device is reduced to submicrometer dimensions, such as VLSI or highly integrated devices, the depletion layers in the source and drain regions overlap to a certain extent depending upon the doping concentration distribution of the channel region of the device. It should be noted that in the enhancement mode, depletion mode, or deep depletion mode of operation of the device, the channel region will be bounded by a vertical N+ and P+ region for the source and drain down to at least a distance of 0.25 micrometers from the silicon/silicon dioxide interface and usually through the entire Si film to the sapphire. This bound is due to the vertical slope of the etches of the gate conductor. Immediately below the channel region, the depletion layers overlap more and punchthrough is enhanced. Punchthrough is symptomized by a drain-source voltage dependence of the subthreshold current. It is also known as a short channel effect.

One approach to a channel making process for forming the source and drain regions as a MOS device is shown in U.S. Pat. No. 4,198,250, which utilizes a gate masking member which is etched and the gate oxide beneath the gate undercut to form overhangs. When a substrate is subjected to ion implantation with such a mask, a much shallower concentration of impurities is implanted in the substrate beneath the overhangs than in the substrate region not protected by the masking member. Such a process provides self alignment for the gate and the source and drain regions will be overlapped by the gate more than with the plain self-aligned gate process. The Miller capacitance will be increased slightly compared to the usual S.A.G. (Self-Aligned Gates) process, but, the likelihood for punchthrough is reduced.

The disadvantage of the process described in the above noted patent is that the amount of undercut for submicrometer gate dimensions is uncontrollable. The prior art describes a process for 2-4 $\mu$m gate lengths where the undercut is typically 0.25 to 0.5 $\mu$m on each side. However, it is obvious that any undercut of a 0.5 $\mu$m gate length will be too significant, e.g., only 300 Angstroms on a side undercut is 12% and is not uniform from wafer to wafer and on an individual wafer because of the isotropic etches required by the prior art.

SUMMARY OF THE INVENTION

Briefly and in general terms, the present invention describes a process for forming a doped region in a substrate which is in alignment with a circuit member. More particularly, the invention includes the steps of forming a masking member on an upper layer portion of the substrate, the masking member defining the outline of the circuit member; and etching the layer employing the masking member as a mask to define the circuit member, the etching continuing such that the circuit member includes sloping side faces. An impurity is then ion implanted into the substrate so as to form the doped region, the dosage and energy of ions implanted being selected such that ions are partially blocked by the portions of the circuit member beneath the sloping side faces, thereby providing a more lightly doped and more shallow distribution of implanted species in the substrate region under the sloping side faces which is an extension of the doped region, than in the doped region.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENT

Figure 1:
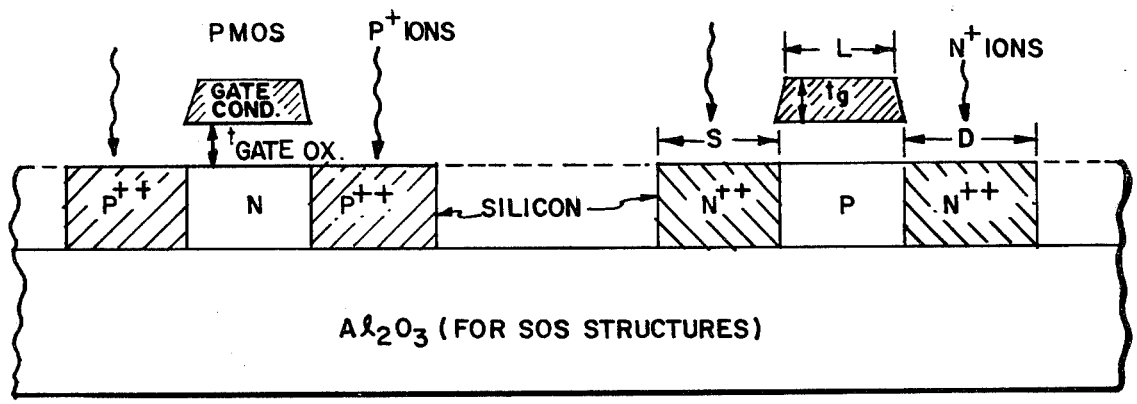
FIG. 1 is a cross-sectional view of a silicon-on-sapphire structure according to the prior art.

FIG. 1 is a cross-sectional view of a silicon-on-sapphire structure using a self-aligned gate (S.A.G.) process. The Figure shows the sapphire (Al$_2$O$_3$) substrate, a silicon layer thereover with heavily implanted regions (P++ and N++) shown cross-hatched, and the shape and position of the gate conductor. The gate oxide is not shown for simplicity, although the gate oxide thickness $t_{gateox}$ is represented in the Figure, as well as the thickness of the gate $t_g$.

The fabrication process according to the present invention is based upon an analysis of the submicrometer gate length structure of the depletion layers which is predicted, or analyzed, by such device performance computer programs as GEMINI (GEMINI Program, Stanford University Electronics Laboratory) and others which calculate the electric field distribution in two dimensions in the channel and are capable of using fabrication process parameter data from computer programs such as SUPREM (SUPREM Program, Stanford University Electronics Laboratory). If the length of the channel region is somehow increased in the channel region approximately 0.25 μm below the Si-SiO$_2$ interface (where the total SOS film thickness is ≦0.5 μm), the conditions for punchthrough are reduced and the short channel behavior of the device can be eliminated under proper design constraints with respect to the channel dopant concentration profiles.

Figure 2:
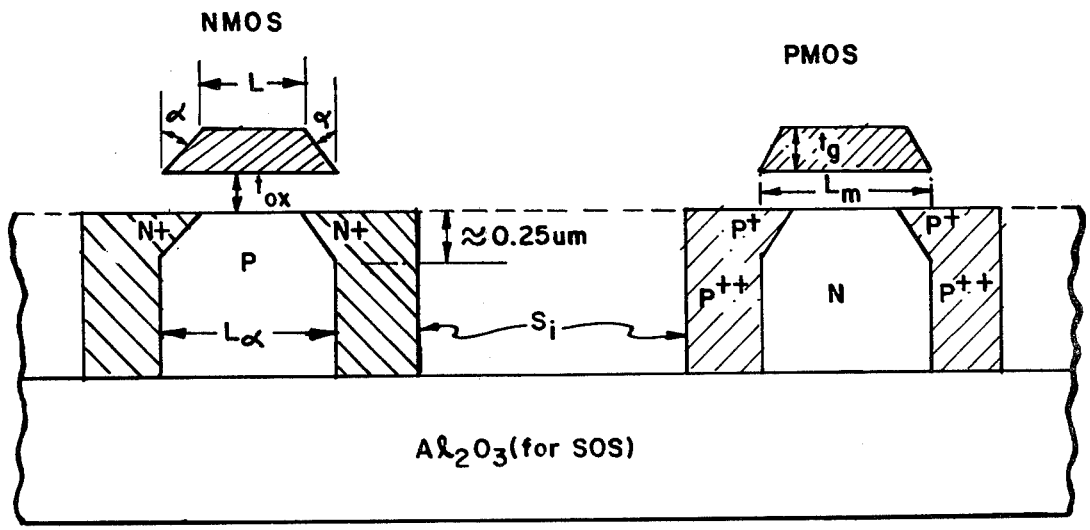
FIG. 2 is a cross-sectional view of a silicon-on-sapphire structure employing the truncated pyramidal gate element according to the present invention.

Turning next to FIG. 2, there is shown a cross-sectional view of a CMOS/SOS device fabricated according to the technique of the present invention. It is noted that the gate elements in both the N-MOS and P-MOS transistors are depicted in the cross-sectional view are in the shape of a trapezoid. In three dimensions, the shape of the gate element would be a truncated pyramid. It is noted from FIG. 2 that the sides of the pyramid are slopped away from the normal or perpendicular direction to the surface by an angle of α where α is greater than 30°. The truncated portion of the pyramid has a top major surface with a length equal to "L", approximately 0.5 to 0.75 microns. The thickness of the gate $t_g$ is typically between 3000 and 4000 Angstroms. The length of the base of the pyramid is $L_α$, which is $L+2t_g$ Tan α. The typical experimental data shows L=0.7μ, (with $t_g$=3050 Angstroms). The distance between the bottom surface of the gate element and the upper major surface of the silicon structure, which is equivalent to the thickness of the gate oxide is $t_{ox}$, which is approximately 100 to 350 Angstroms.

The fabrication process according to the present invention focuses upon the masking property of a circuit member, such as the gate conductor, as a function of its thickness with respect to the N+ and P+ ion implants, and also upon the slope of the gate conductor edges deviating from the vertical. Although if the thickness, t, of the gate conductor at any point on the dimension of the gate conductor is less than that required to shield, or mask, the channel region from the N+ or P+ S.A.G. implants, $t_g$, the dopant ions will penetrate into the silicon immediately beneath the Si-SiO$_2$ interface to an extent depending upon the extent that the gate conductor thickness is less than $t_g$. A gate conductor with edges that deviate from the vertical by some angle, α, will therefore have a degenerately doped S and D region that will extend beneath the maximum dimension, $L_m$, of the gate with a depth distribution that will depend on α as shown in the cross-sectional view of the device according to the present invention in FIG. 2. The etch procedure requires a definitely anisotropic characteristic such that the sloped resist edge profile of the gate pattern is faithfully reproduced in the gate conductor. There is no masking member of the gate conductor other than the resist hence there is one less oxidation and etch step than the prior art. The gate oxide (100-350 Angstroms) is not etched. It is most important to point out from this figure that the channel dimension at about 0.25 μm below the Si-SiO$_2$ interface where punchthrough of the S and D depletion regions was formerly a problem, is now increased to a dimension, $L_α$>L. Therefore, the principal source of the short channel behavior of submicrometer MOSFET devices can be eliminated or at least greatly reduced in the structure formed by the process according to the present invention.

Turning next to the silicon structure itself, it is noted that the source and drain regions are determined by ion implanting through the gate oxide layer with the region under the gate pyramid being masked from the implant by the gate material of thickness, $t_g$. The areas ion implanted are indicated by the cross hatched regions in FIG. 2 to indicate that the amount of implantation or concentration of the dopant species is controlled so that some implantation occurs through the thin tapered edges of the gate element to form a lighter and shallower degenerately doped region directly under the tapered edges of the gate adjacent to the top major surface of the silicon semiconductor. The Figure indicates that this shallower degenerately doped region extends into the semiconductor body a distance of approximately 0.25 microns. Most of the ion implantation is implanted into the semiconductor body in the regions not protected by the masking member formed by the gate element. Directly underneath the center portion of the gate element there is effectively no ion implantation into the semiconductor body.

The GEMIMI Program can be used to predict the device behavior with respect to the short channel effect and is based similar to the "Bell Criterion." (J. R. Brews et al., IEDM Washington, D.C., December 1979). If $L_α$ or L is large enough such that the subthreshold MOSFET current will have a negligible dependence on the drain supply voltage, $V_D$, the criterior for L or $L_α$ being large enough depends upon the channel dopant concentration and its profile with respect to depth into the silicon from the Si-SiO$_2$ interface.

A sloped gate edge connector can readily be fabricated by the technique according to the present invention. An image reversal resist technique using electron beam exposure of a positive photoresist followed by an optical UV flood exposure results in the positive photoresist behaving as a negative resist. (W. G. Oldham, E. Heike, IEEE Trans. EDL-1 (10), 217, 1980). The resist edge profiles using this method are sloped with some angle, α, from the vertical. If a dry etching technique (Fineline Lithography, Roger Newman, ed., North Holland Publishing Co., Amsterdam, 1980 (Chap. 4., R. L. Maddox, M. R. Splinter)), such as ion milling, reactive ion etching, parallel plate plasma etching, or reactive ion beam etching is used, an etched gate conductor profile with slope of angle, α, cam be faithfully reproduced from the resist profile.

In addition, the characteristic of sloped gate conductor edge profiles allows for a much relaxed step coverage condition in consideration of conductor layers deposited on top of the gate conductor pattern which criss-cross and still maintain continuity such as is required for VLSI.

One possible drawback regarding the present configuration is the increased Miller capacitance caused by the gate electrode overlapping the sloped gate edges. This overlap will be equal to $X=t_g$ tan α. With an angle on the order of 45°, the current $t_g$ is about 0.3 μm. Therefore, a Miller capacitance of about 30% of the channel gate input capacitance would be the result. However, for submicrometer devices, the gate input capacitance is no longer the dominant factor compared to the interconnect capacitance and, hence, the speed of the device would not be nearly as affected as if the situation were directly scaled up to a 4 μm gate length, for example. Note also that α can be adjusted by the Electron Beam Lithographic, EBL, or other resist processing variables with respect to the image reversal technique (W. G. Oldham, E. Heinke, IEEE Trans. EDL-1 (10), 217, 1980) such that the overlap capacitance is less than 30%. Also, $t_g$ can be adjusted for a reduction. However, reducing the Miller capacitance will reduce $L_α$ and a compromise must be made.

Turning next to FIGS. 3a through 3e, there is shown the sequence of steps for forming the gate elements and the implanted source and drain regions according to the present invention.

Figure 3A:
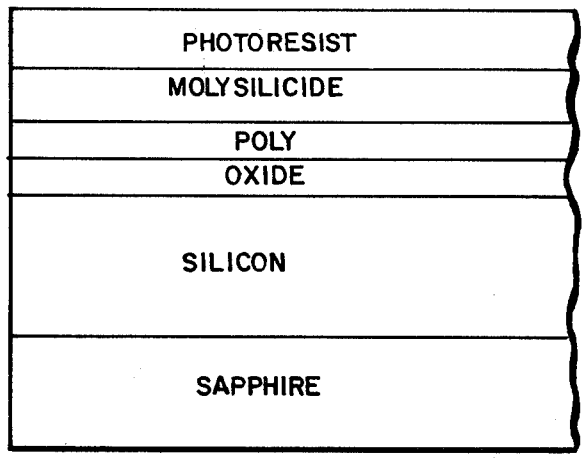
FIGS. 3a through 3e are cross-sectional views of a silicon-on-sapphire structure illustrating the sequence of steps for forming the doped source and drain regions in the said layer according to the present invention.

Turning first to FIG. 3a, there is shown a composite of a silicon-on-sapphire which may be used for ion implanting according to the present invention. The silicon layer on the sapphire substrate typically has a thickness between 4500 and 6000 Angstroms. The structure includes a gate oxide layer on the top major surface of the silicon layer, followed by a polycrystalline silicon (polysilicon) layer over the oxide layer. The polysilicon layer is typically doped with phosphorous so that it is N+ conductivity and has a thickness between 800 and 1200 Angstroms. A molysilicide layer is applied over the P+ or N+ polysilicon layer, and a photoresist layer applied over the molysilicide layer. The use of any suitable refractory metal silicide (e.g. tantalum silicide, tungsten silicide or titanium silicide) is also within the scope of the present invention. The use of a polysilicon-molysilicide layer is used in the preferred embodiment because of the greater conductivity provided by such a structure and its suitability for ultra large scale integrated devices. Other conductive layers can be used as well. According to the techniques of the present invention, the photoresist layer is a positive photoresist layer.

Figure 3B:
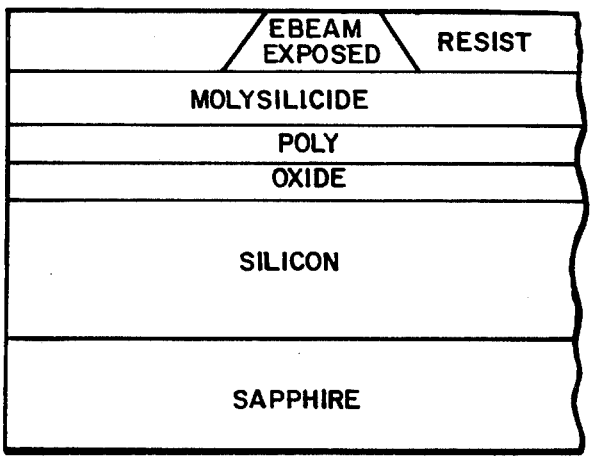

Turning next to FIG. 3b, there is shown the step in which the photoresist layer is selectively exposed to an electron beam in a predetermined pattern. The layer of photoresist is exposed where the electron beam passes and this photoresist layer portion is to remain after further processing.

The electron beam is directed to the resist substantially normal to the surface of the resist layer. As it penetrates into the thickness of the layer, the electron beam scatters, and diverges from the surface. The net affect of the scattering of the electrons in the resist layer is the exposure of the resist in a cross-section representing a trapezoid such as that shown in FIG. 3b. Since the area exposed by the electron beam is typically that of a gate element, or other channel structure in a self-aligned MOS-MIS-MES device, the actual geometric structure exposed in the resist layer is that of a truncated pyramid. The use of an electron beam for exposure of a positive resist is also described in the article W. G. Oldham, E. Heinke, IEEE Trans. EDL-1 (10), 217, 1980.

Figure 3C:
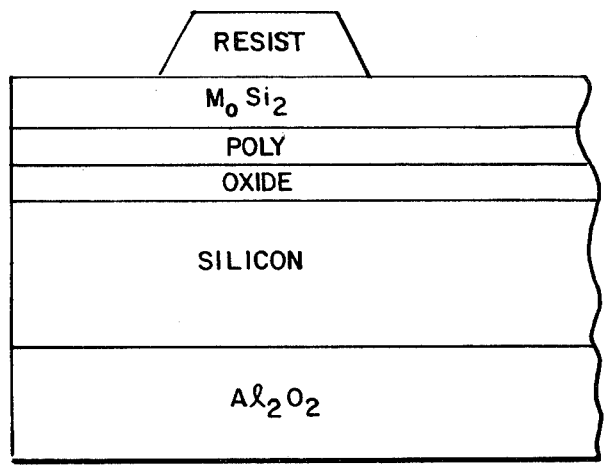

Following exposure to the electron beam, the entire photoresist layer is flooded with ultraviolet light. The ultraviolet light reacts differently with the portions of the resist exposed by the electron beam that the portions which have not been exposed. The net effect is that after the layer of photoresist is etched, the portions which have been exposed to the electron beam remain, such as shown in FIG. 3c. The truncated pyramidal resist structure is then used as a mask for removing portions of the conductive layer which do not lie under the mask. The removal of these portions of the conductor layer is achieved by a standard etching process such as reactive ion etching or ion milling.

Figure 3D:
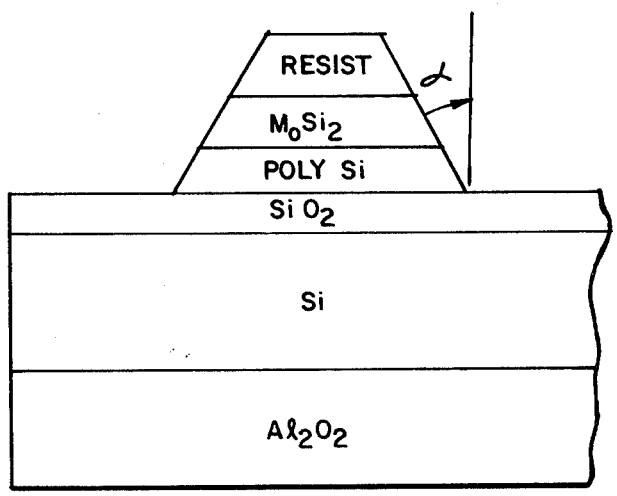

The etching process leaves truncated pyramidal elements consisting of a top layer of resist, followed by a lower conductive layer or layers. Such truncated pyramidal structures lie on the silicon oxide surface of the body as is shown in FIG. 3d.

The next process step is to remove the remaining resist layer from the top of the pyramid. This is performed by the process of plasma etching.

Figure 3E:
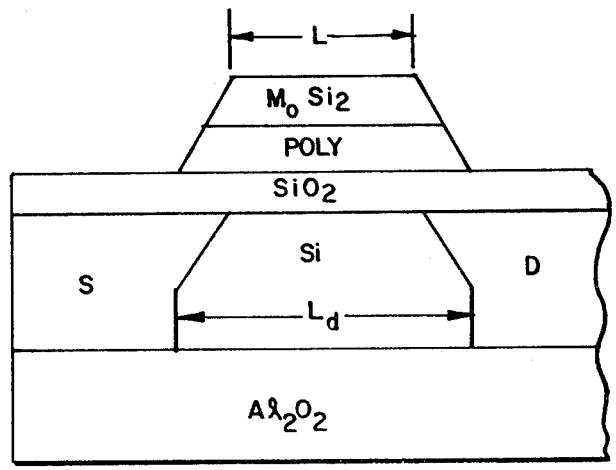

The structure which remains is shown in FIG. 3e which consists of a truncated pyramidal gate type element which overlies the silicon semiconductor body. Such a structure is then used as a mask for ion implanting the source and drain regions of the semiconductor body in a self-aligned manner as is known in the techniques according to the art. The impurity profiled distribution in the source and drain regions and in the channel after ion implantation is substantially as shown in FIG. 3e. The net effect is that the distance between the source and drain regions are closest at the surface of the semiconductor body and spaced further apart as the distance from the surface increases.

It is noted that some implanation occurs in the substrate region below the sloping side faces of the gate-type circuit element. Such implanation results in the formation of a more lightly doped source and drain regions beneath such side faces, while more heavily doped source and drain regions are provided in the silicon regions unprotected by the masking member. The doses and energy of the ions implanted are so selected such that the ions are partially blocked by the portion of the gate structure beneath the sloping side faces, so as to provide a more shallow distribution of the implanted species in the region directly underneath the sloping side faces than in other regions.

The result of the formation of the gate element according to the present invention is a self-aligned process in which the distance between the source and the drain regions in the depth of the semiconductor body (i.e., semiconductor regions deeper than $0.25\mu$ from the top major surface) are relatively spaced apart a greater distance than at the surface, thus minimizing the problem of punchthrough.

While the invention has been illustrated and described as embodied in a microelectronic shadow masking process for reducing punchthrough, it is not intended to be limited to the details shown, since various modifications and structural changes may be made without departing in any way from the spirit of the present invention.

It will be obvious to those skilled in the art that the semiconductor device according to the present invention can be implemented with various semiconductor technologies and different combinations of known process steps, and that the preferred embodiments illustrated here are merely exemplary. The depth of penetration of the various zones and regions and in particular the configuration and distance between the active zones of the transistor devices, as well as the concentrations of dopant species, and/or their concentration profiles, can be chosen depending upon the desired properties. These and other variations can be further elaborated by those skilled in the art without departing from the scope of the present invention.

The present invention is moreover not restricted to the particular embodiments of a microelectronic shadow masking process for reducing punchthrough described. For example, it may be pointed out that semiconductor materials other than silicon, for example, $A_{III}$-$B_V$ compounds may be used. Furthermore, the conductivity types in the embodiment may be interchanged and corresponding to such change, the voltage level and the static or dynamic nature of the signals applied to the various terminals and gates of the device, as well as the voltage sources, may be suitably selected as desired for a particular application. Other types of semiconductor circuits including bipolar junction field effect transistor, MNOS (metal electrode-silicon nitride, silicon oxide-semiconductor), MAOS (metal aluminum oxide, silicon oxide, semiconductor), MAS (metal, aluminum oxide, semiconductor), floating gate FETs, and AMOS FETs (avalanche MOS FETs), may be used as well.

Without further analysis, the foregoing will so fully reveal the gist of the present invention that others can, by applying current knowledge, readily adapt if for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A process for controlling the impurity profile distribution in a body of semiconductor material which includes a conductive layer, comprising the steps of:
    defining a masking member on a laterally extending major surface of said body in a predetermined pattern;
    etching said surface and said body through said conductive layer using said masking member as a mask so as to form a truncated, pyramidal shaped gate element having sides which slope to form tapered gate edges; and
    ion implanting active regions of said semiconductor circuit using said gate element as a mask so as to form active regions having lighter and shallower degenerately doped portions under said tapered gate edges, a channel region being defined under said gate element between said active regions, the length of said channel region extending between said active regions under said gate element, the length of said channel between said degenerately doped portions being less than the length of said channel region beneath said degenerately doped portions.

2. A process as defined in claim 1, wherein said step of defining a masking member comprises the steps of:
    applying a layer of photoresist to said laterally extending major surface of said body;
    exposing said layer of photoresist to an electron beam and ultraviolet light in a predetermined pattern;
    etching said layer of photoresist to remove the unexposed portion of said layer.

3. The process defined by claim 1, wherein conductive layer is a refractory metal polysilicon composite.

4. The process defined by claim 1 wherein said ion implantation comprises source and drain region implantation.

5. A process as defined in claim 1, wherein said body of semiconductor material includes a gate oxide layer, a polysilicon layer over said oxide layer, and a molysilicide layer over said polysilicon layer.

6. A process as defined in claim 2, wherein said photoresist is a positive photoresist.

7. A process as defined in claim 2, wherein said step of exposing said layer of photoresist comprises exposing said layer in a pattern of regions where the photoresist is to remain after subsequent processing.

8. A process as defined in claim 2, further comprising the step of subsequently exposing said layer of photoresist with ultraviolet light.

9. The process defined by claim 3, wherein said refractory metal is molysilicide.

10. A process as defined in claim 5, further comprising the step of developing said layer of photoresist and removing the unexposed portion.

11. A process for fabricating a MOS integrated circuit structure at a predetermined portion of a substrate comprising the steps of:
    forming a continuous silicon layer on said substrate;
    forming a continuous silicon oxide layer on said silicon layer covering at least said predetermined portion;
    forming a polycrystalline silicon layer on said oxide layer such that said silicon layer is insulated from said portion;
    forming a conducting layer on said polycrystalline silicon layer;
    forming a resist layer over said conducting layer;
    etching said resist layer to form a mask having a truncated pyramidal shape;
    milling said conducting layer and said polycrystalline silicon layer using said resist layer as a mask in order to form a gate element having a shape corresponding to the truncated pyramidal shape of said resist layer mask; and
    implanting dopant into said silicon layer using said gate element as a mask so that lighter and shallower degenerately doped areas are formed under the edges of said gate element.

12. The process defined by claim 11 wherein said polycrystalline silicon layer is doped with phosphorus.

13. The process defined by claim 11 wherein said silicon layer is between 4,500 and 6,000 Angstroms in thickness.

14. The process defined by claim 13 wherein said silicon oxide layer is between 100 and 350 Angstroms in thickness.

15. The process for fabricating a MOS silicon integrated circuit structure at a predetermined area on a silicon body portion comprising the steps of:
    forming a continuous silicon oxide layer on said body portion covering at least one area;
    forming a polycrystalline silicon layer on said oxide layer such that said silicon layer is insulated from said body portion at said area;
    forming a conducting layer on said polycrystalline silicon layer;
    forming a masking layer on said conducting layer;
    etching said masking layer to form a masking structure having a predetermined pattern;
    etching said conducting layer and said polycrystalline silicon employing said masking structure as a mask; whereby a truncated pyramidal shaped gate element having sloping sides is formed on said oxide layer; and
    ion implanting active regions of said semiconductor circuit using said gate element as a mask so as to form doped regions at opposite ends of said gate element, wherein said doped regions have lighter and shallower degenerately doped portions under said gate element sides so that during operation of said MOS silicon integrated circuit structure, carrier punch-through between said doped regions and beneath said gate element is retarded.

16. The process as defined in claim 15 wherein said conducting layer has a thickness between 3,000 and 4,000 Angstroms.

17. The process as defined in claim 16 wherein said conducting layer is composed of a N+ polysilicon first layer having a thickness between 800 and 1,200 Angstroms, and a refractory metal silicide second layer.

18. A process for controlling the impurity profile distribution in a body of semiconductor material which includes a conductive layer on a major surface thereof, comprising the steps of:
   forming a masking layer over said conductive layer;
   exposing said masking layer in a predetermined pattern by an electron beam;
   subsequently exposing said entire masking layer to ultraviolet light;
   etching said masking layer to remove the unexposed portion of said layer;
   etching said surface and said body through said conductive layer using said masking member as a mask so as to form a truncated pyramidal shaped element having sloped sides; and
   ion implanting active regions of said semiconductor circuit using said element as a mask so that said regions are more lightly doped and the implanted dopant distribution is more shallow directly beneath said sloped sides of said elements than in regions away from said masking member thus forming shallow active portions of said active regions at opposite ends of said element, so that a channel is defined under said element and between said active regions, and so that punch-through between said active regions and beneath said shallow active areas is retarded.

19. The process defined by claim 18, wherein conductive layer is a refractory metal-polysilicon composite.

20. The process defined by claim 18 wherein said ion implantation comprises implanting source and drain regions of a field-effect transistor.

21. A process as defined in claim 18, wherein said body of semiconductor material includes a gate oxide layer, a polysilicon layer over said oxide layer, and a refractory metalsilicide layer over said polysilicon layer.

22. A process as defined in claim 18, wherein said masking layer is a positive photoresist.

23. The process defined by claim 19, wherein said refractory metal is selected from the group consisting of molysilicide, tantalum silicide, tungsten silicide and titanium silicide.

24. A MOS process for forming source and drain regions in a substrate which includes a gate oxide layer and polysilicon layer comprising the steps of:
   defining a masking member on said polysilicon layer in a predetermined pattern;
   etching said polysilicon layer to form a gate employing said masking member as a mask, said etching forming a truncated pyramidal gate structure having sloped edge faces, the base of said pyramidal gate structure being disposed on said gate oxide layer;
   ion implanting said substrate to form said source and drain regions through said gate oxide, the dosage and energy of ions implanted being selected so that a lower concentration and more shallow distribution of impurities is implanted in substrate regions beneath said sloped edge faces than in substrate regions not protected by said gate structures so that a channel is defined beneath said gate and between said source and drain regions, and so that the length of said channel is shorter near said gate and longer away from said gate; and
   whereby during subsequent processing steps, said lower concentration of impurities does not substantially diffuse, thereby providing more precise alignment between said gate structure and said source and drain regions.

25. A process for forming a MOS field effect transistor on a substrate comprising the steps of:
   forming a gate oxide layer on said substrate;
   forming a layer of polysilicon over said gate oxide layer;
   defining a masking member on said polysilicon layer in a predetermined shape including sloping side faces;
   etching said polysilicon layer employing said masking member as a mask to form a gate for said field-effect transistor, including etching said polysilicon layer under said masking member to form said gate with sloping side faces which extend from the sloping side faces of said masking member;
   ion implanting said substrate to form source and drain regions by ion implanting through said gate oxide, such that some implantation occurs in the substrate region beneath said sloping side faces of said gate, thereby forming more lightly doped source and drain regions beneath said side faces and more heavily doped source and drain regions in substrate areas unprotected by said masking member so that punch-through between said source and drain regions deep within said substrate is retarded during operation of said field effect transistor; and
   whereby during subsequent processing steps, the lower concentration of impurities in said more lightly doped source and drain regions does not substantially diffuse beneath said gate, thereby providing more precise alignment between said gate and said source and drain regions.

26. In a process for forming a doped region in a substrate which is in alignment with a circuit member, the improved steps comprising:
   forming a masking member on a layer, said masking member defining the outline of said circuit member;
   etching said layer employing said masking member as a mask to define said circuit member, said etching continuing such that said circuit member includes sloping side faces;
   implanting impurity ions into said substrate so as to form said doped region, the dosage and energy of ions implanted being selected such that ions are blocked by said circuit member with a portion of said impurity dosage allowed to pass through said sloping side faces thereby producing said doped region with a more lightly doped and more shallow distribution of implanted impurity beneath said sloping side faces so that punch-through deep within said substrate is retarded; and
   whereby in subsequent processing steps said more lightly doped regions do not substantially diffuse beneath said circuit member.

* * * * *